United States Patent [19]

Penchuk

[11] Patent Number: 5,895,966
[45] Date of Patent: Apr. 20, 1999

[54] INTEGRATED CIRCUIT AND SUPPLY DECOUPLING CAPACITOR THEREFOR

[75] Inventor: Robert A. Penchuk, Wrentham, Mass.

[73] Assignee: Analog Devices, Inc., Norwood, Mass., MA

[21] Appl. No.: 08/975,736

[22] Filed: Nov. 21, 1997

Related U.S. Application Data

[63] Continuation of application No. 08/536,426, Sep. 29, 1995, abandoned.

[51] Int. Cl.$^6$ ............................. H01L 23/48; H01L 23/52
[52] U.S. Cl. .................... 257/690; 257/665; 257/676; 257/700; 257/924; 257/706
[58] Field of Search .................. 257/691, 690, 257/665, 676, 700, 701, 706, 924

[56] References Cited

U.S. PATENT DOCUMENTS

| | | | |
|---|---|---|---|
| 5,095,359 | 3/1992 | Tanaka et al. | 257/691 |
| 5,196,725 | 3/1993 | Mita et al. | 257/691 |
| 5,220,195 | 6/1993 | McShane et al. | 257/691 |
| 5,311,057 | 5/1994 | McShane et al. | 257/691 |
| 5,366,931 | 11/1994 | Kim | 437/209 |
| 5,386,141 | 1/1995 | Liang et al. | 257/691 |
| 5,468,994 | 11/1995 | Pendse | 257/691 |
| 5,508,556 | 4/1996 | Lin | 257/691 |

FOREIGN PATENT DOCUMENTS

| | | |
|---|---|---|
| 58-164246 | 9/1983 | Japan . |
| 61-269317 | 11/1986 | Japan . |
| 62-055954 | 3/1987 | Japan . |
| 22-96360 | 12/1990 | Japan . |
| 4-006860 | 1/1992 | Japan . |
| 4-051549 | 2/1992 | Japan . |
| 52-67557 | 10/1993 | Japan . |
| 1 287 110 | 12/1969 | United Kingdom . |
| 2 258 943 | 2/1993 | United Kingdom . |

OTHER PUBLICATIONS

Karnezos, Marcos et al, "EDQUAD–An Enhanced Performance Plastic Package", IEEE, Jan. 5, 1994, pp. 63–66.

*Primary Examiner*—David Ostrowski
*Attorney, Agent, or Firm*—Wolf, Greenfield & Sacks, PC

[57] ABSTRACT

An integrated circuit assembly is formed with an integral power supply decoupling capacitor for monolithic circuitry in a semiconductor substrate by using the substrate itself as one plate of the capacitor. A dielectric is formed on the "back" side, or surface, of the substrate (i.e., the surface opposite the surface in which component structures are formed) such as by growing a native oxide thereon. Using a conductive epoxy, the back side of the substrate (actually, the dielectric layer thereon) is then attached to a conductive foundation member, which forms the other plate of the capacitor when a potential is applied across the substrate and the foundation member. The conductive foundation member also may be connected to a heat sink structure integral with the package. The heat sink may extend through a window in the package, providing a path and surface via which heat may be transferred to an external heat sink if a larger heat sink mass is needed. For safety, the heat sinks and the die attach paddle may be maintained at a suitable potential, such as ground, while the substrate can be at another supply potential.

7 Claims, 1 Drawing Sheet

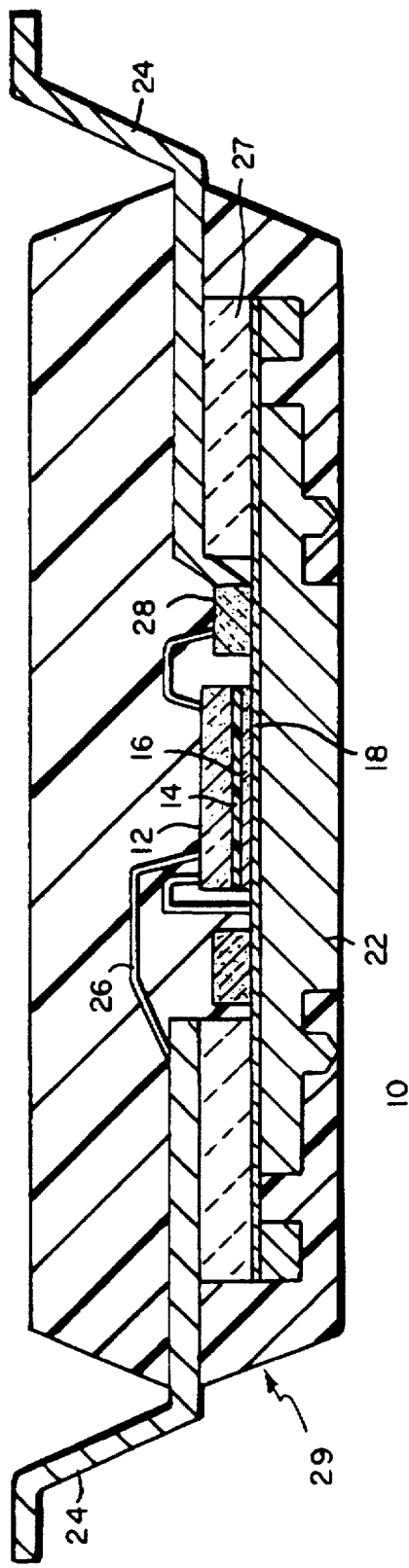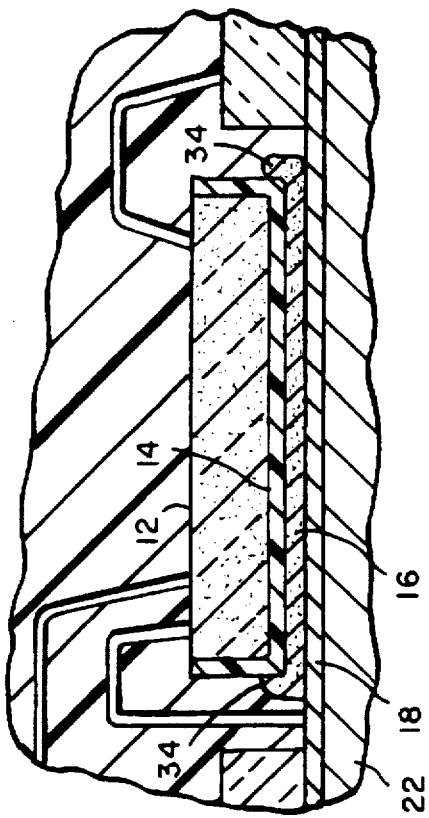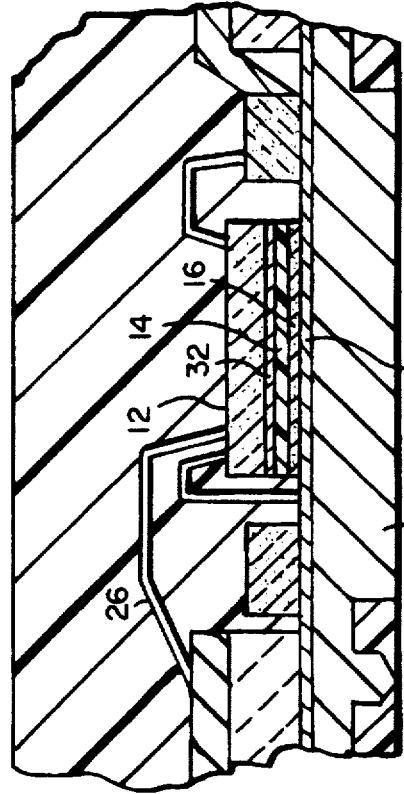

INTEGRATED CIRCUIT AND SUPPLY DECOUPLING CAPACITOR THEREFOR

This application is a continuation of application Ser. No. 08/536.426, filed Sep. 29, 1995 now abandoned.

FIELD OF THE INVENTION

This invention relates to the field of semiconductor integrated circuit manufacturing and packaging, as well as to the field of circuit design, in general. More particularly, the invention relates to a low-inductance power supply decoupling capacitor for use in an integrated circuit package, and an integrated circuit assembly including such a capacitor and a heat sink in heat-conductive communication with the integrated circuit substrate and exposed to the package exterior.

BACKGROUND OF THE INVENTION

In the field of circuit design, it is well known that when multiple circuits or circuit stages are connected to a common power supply rail, undesired coupling may occur between the circuits or stages. This undesired coupling occurs, for example, when a first circuit switches on, drawing a significant amount of current, and the voltage on the supply rail momentarily drops as a result. Other circuits which receive a supply voltage from that supply rail experience the same drop in supply voltage. In turn this may cause the outputs of such other circuits to fluctuate or otherwise deviate from their normal conditions. For example, a voltage spike or oscillation might appear in the output of another of said circuits. Broadly speaking, the undesired artifact in the latter circuit's output is noise induced by operation of the first circuit. This noise can propagate through yet further circuits or stages and corrupt the device's ultimate outputs or at least degrade its performance.

To reduce or eliminate this noise, it is customary to try to isolate each circuit from noise on the supply voltage rails by providing a capacitor between a common ground and the point where each circuit connects to the supply rail—or as close thereto as possible. These capacitors act as low impedances to high-frequency switching noise and smooth out the voltage at each circuit's supply node.

Unfortunately, in integrated circuit "chips", monolithic capacitors of the size required for effectively decoupling from the supply rails tend to have fairly large capacitance values (e.g., in the range of 22 to 47 microfarads) and require considerable area. Therefore, it is generally not cost-effective to provide within the monolithic structure of an integrated circuit capacitors of sufficient capacitance to provide decoupling to an acceptable level. Additionally, in RISC and DSP processor chips, particularly those of high bandwidth, and other high density digital or analog chips, little room exists on a die for the fabrication of sufficiently large monolithic capacitors. Therefore, either discrete decoupling capacitors are connected to the integrated circuit "chip" within the package that houses the chip (but not within or on the substrate) or they are added externally to the package in a socket or on a printed circuit board or the like, when the system using the packaged chip is assembled. Of course, the further each capacitor is from the associated supply node in the circuit (i.e., the node to be connected to the supply rail), the greater the inductance and resistance between the capacitance and the circuit node. This inductance can interfere with the desired operation of the capacitor, particularly in high-speed circuits.

Power supply decoupling is particularly necessary in high-speed digital circuitry, where transient voltage spikes on power rails can induce erroneous logic level outputs. High-speed processors and memory circuits, for example, may store or provide as output erroneous data if inadequate supply decoupling is provided. However, the provision of in-package decoupling capacitors is complicated with such circuits not only by virtue of the fact that these circuits typically draw large switching currents (such as on the order of 10 Amperes or more), but also because they may dissipate relatively high amounts of power in the form of heat. To facilitate the removal of this heat, a heat-conductive path (which generally is electrically conductive, also) typically is provided between the substrate of the integrated circuitry and the exterior of the package, where it may be placed in contact with a heat sink. Safety considerations and attendant regulations generally require that the heat conductor, which could be touched by maintenance personnel, for example, be maintained at ground potential. In an embedded RAM process, an n-type substrate is often used and an n-type memory area may be placed in a p-well to isolate it from substrate currents generated by high speed digital circuits. Since the substrate is connected to a different supply potential, care is typically taken to isolate the substrate electrically from the heat conductor. Generally this is done at least partly by securing the substrate to the heat conductor with a non-conductive epoxy. However, this introduces a reliability concern for a large die since non-conductive epoxy typically has low shear strength. Alternatives, such as diamond shims are expensive and complicate assembly.

Thus, there is a need for a low cost decoupling capacitor which can be assembled into an integrated circuit package and which presents low inductance. This capacitor preferably will be compatible for use with high-speed digital circuitry, particularly monolithic circuitry which requires a heat conductor affixed to the substrate to conduct excess away therefrom and to an external heat sink which is brought in contact with the package containing the circuitry.

SUMMARY OF THE INVENTION

According to the invention, an integrated circuit assembly is formed with an integral power supply decoupling capacitor for monolithic circuitry in a semiconductor substrate by using the substrate itself as one plate of the capacitor. A dielectric is formed on the "back" side, or surface, of the substrate (i.e., the surface opposite the surface in which component structures are formed) such as by growing a native oxide thereon. Using a conductive epoxy, the back side of the substrate (actually, the dielectric layer thereon) is then attached (thermally and electrically) to a conductive foundation, which forms the other plate of the capacitor when a potential is applied across the substrate and the foundation. The foundation preferably is metal and may be a die-attach paddle alone, a metal heat sink structure alone or a die-attached paddle in contact with a heat sink structure, for example. A heat sink structure may be integral with the package, extending through a window in the package, providing a path and surface via which heat may be transferred to an external heat sink if a larger heat sink mass is needed.

The capacitor thus formed is created at almost no incremental cost, has substantial capacitance and virtually no inductance or series resistance associated with it. Other features, advantages and object of the present invention will become more apparent and be more readily understood from the following detailed description, which should be read in conjunction with the accompanying drawing.

BRIEF DESCRIPTION OF THE DRAWING

In the drawing,

FIG. 1 is a diagrammatic cross-sectional view of a packaged semiconductor integrated circuit assembly employing a first example of a supply decoupling capacitor according to the invention;

FIG. 2 is a diagrammatic cross-sectional view of a second example of a packaged semiconductor integrated circuit assembly according to the invention, further including a metallization layer on the back side of the die; and FIG. 3 is a further cross-sectional view of an exemplary packaged semiconductor integrated circuit assembly according to the invention, illustrating a dielectric layer formed after die sawing, to cover not only the back side of the die, but also the edges and at least part of the sides.

DETAILED DESCRIPTION

Turning now to FIG. 1, there is shown a diagrammatic illustration, in cross-section, of an integrated circuit assembly 10 having a supply decoupling capacitor according to the invention. A substrate 12 of a semiconductor material such as silicon has been subject to conventional processes to form therein structures creating a variety of circuits in its top side. Once the circuits have been formed in the substrate, a dielectric layer 14 is formed on the back (bottom) side of the die (i.e., substrate) 12. The dielectric layer 14 may be a native oxide (e.g., $SiO_2$) grown by exposing the wafer to an appropriate oxygen-containing atmosphere for a sufficient time at a sufficient temperature (e.g., room temperature for several hours). The growth of such a native oxide is easy to control and sufficient uniformity of thickness is readily achieved. Using a layer of conductive epoxy such as 84-1 LMIS conductive epoxy from Ablestik, Rancho Domingo, Calif., 16, the back side of the die is mounted to a conductive foundation. In the illustrated embodiment, the foundation employs, in part, a die attach paddle 18 on a lead frame (not shown). The die attach paddle may be bonded to a metal heat sink 22, as shown. The use of a die attach paddle is optional, however, as the die may be mounted directly to a conductive heat sink. Using conventional techniques, leads and other structures (e.g., leads 24) are added to the assembly; and with wire bonding, the leads are connected electrically to appropriate circuit bond pads on the die via wires such as wire 26, or otherwise. Leads 24 may be mounted on ceramic supports 27 for structural support and electrical isolation. An interposer ring 28 of copper also may be employed to provide a low impedance power connection. The entire assembly may then be placed in a package 29 such as by plastic encapsulation or other suitable techniques.

When a potential difference is applied between the substrate (e.g., leads 24) and the die attach paddle (or heat sink, if the same is conductively connected to the die attach paddle), a large supply decoupling capacitor is formed, using the native oxide as its dielectric. The plates (electrodes) of the capacitor are the substrate and the die attach paddle, respectively.

Larger IC dies (also referred to as dice) generally contain more circuitry providing more functions, draw more current transients from the supply, and thus require more supply decoupling. Advantageously, the larger the chip die, the larger the area of the decoupling capacitor formed by this invention and (for the same thickness and composition dielectric) the larger the decoupling capacitance thereby provided.

If the surface of the back side of the die is not sufficiently smooth, problems may arise. There may be places where the oxide is too thin or where high field intensities cause the dielectric to break down. This can damage or destroy the operability of the chip. Consequently, the manufacturing process must assure the oxide is thick and conformal enough to prevent the formation of pinhole short circuits—i.e., to endure (1) the current surges which result from circuit operation and (2) the field intensities attributable to the applied potential difference and wafer back side irregularities. Polishing the wafer back side prior to growing the oxide will help in this regard; chemical polishing is believed preferable to mechanical polishing. The oxide thickness required to prevent break down may be reduced if part of the supply voltage is dropped across depletion capacitance from the die top, where a low impedance supply connection is made, to the back side of the die. Depletion capacitance occurs between an n-type substrate and a more highly doped n+ well, in the case of a twin-well process, or n+ epi, in the case of an epitaxial process. Optionally, as shown in FIG. 2, a thin film metallization layer 32 may be deposited on the back side (surface) of the die (using conventional techniques) before the dielectric layer is formed. Of course, this may require different steps (appropriate to the selected metal) for the subsequent formation of a dielectric layer— which may, but probably would not, be an oxide. The selection of an appropriate dielectric composition and its formation or application are within the abilities of those skilled in integrated circuit fabrication. Depositing a metallization layer may add some cost to the process or it may save cost relative to polishing. In any event, it is one way to provide a rather smooth surface and thus permits use of a thin dielectric layer. Ideally, the thinner the dielectric layer the higher the capacitance, provided, of course, the layer is not so thin as to break down. Regardless of the approach adopted, it is well within the skill of those in the semiconductor fabrication industry to ensure the dielectric layer is thick enough to withstand tunneling (and, thus, breakdown) under the voltage to be applied but thin enough to provide substantial capacitance.

The action of sawing a wafer into individual dies will introduce roughness at the die edges. Moreover, conductive epoxy overlap at the die edges could cause short circuits between the substrate (which is connected to a first supply voltage, $V_{DD}$) and the die attach paddle (which is connected to a second supply voltage, $V_{SS}$, which may be ground). Thus the die may have to be sawn before the oxide is grown or the dielectric layer otherwise is formed. If the dielectric (e.g., oxide) layer is formed after sawing of the substrate, the oxide layer will form also on, and will protect, the edges and sides of the substrate, as at 34 in FIG. 3. When the epoxy flows around the sides of the die it will not create a short-circuit because the oxide will provide an insulating barrier.

In practice, it has been found that for an n-type silicon substrate of die size 13×15.7 mm, a nominal $SiO_2$ dielectric thickness of 20 Angstroms and Ablestik 84-1 LMIS conductive epoxy, a 3.5 microfarad decoupling capacitor was formed, exclusive of depletion capacitance.

Having thus described various illustrative embodiments of the invention, some of its advantages and optional features, it will be apparent that such embodiments are presented by way of example only and not by way of limitation. Those persons skilled in the art will readily devise alterations and improvements on these embodiments, as well as additional embodiments, without departing from the spirit and scope of the invention. For example, rather than growing an $SiO_2$ dielectric layer, the die may be placed in a nitrogen-rich atmosphere at a temperature and for a time sufficient to form a higher-dielectric layer of $Si_3N_4$. Other dielectric compositions will occur to those skilled in the art. By using a ferroelectric isolator such a PZT, an increase in capacitance of 100-fold is possible. Use of such ferroelectrics is becoming common in memory processes to increase memory cell capacitance. Of course, the resulting increase in capacitance (assuming all other parameters remain the same) comes at an increase in cost. Additionally, it should be appreciated that the substrate wafer may be either an epitaxial (epi) or non-epitaxial type wafer. Use of an epi wafer will present a lower series resistance to current which passes through the decoupling capacitance. Still further variations will be apparent to those skilled in this art. It is impossible to enumerate them all. Accordingly, the invention is limited only as defined in the following claims and equivalents thereto.

What is claimed is:

1. An integrated circuit assembly comprising:
   a. a semiconductor substrate adapted to be connected to a substantially non-zero potential;
   b. a layer of a dielectric material covering a first surface of the semiconductor substrate;
   c. a conductive foundation member;
   d. electrically conductive paths to a surface of the substrate opposite the first surface thereof and to the foundation member, for connection across a supply voltage;
   e. the dielectric material layer being of a substantially uniform thickness;
   f. the semiconductor substrate being of n-type material;
   g. the conductive foundation member being adapted to be connected to a substantially ground potential;
   h. circuitry formed in or on the substrate at the surface of the substrate opposite the first surface covered by the dielectric layer thereof;
   i. the dielectric layer being conductively mounted to the foundation member by use of a conductive adhesive;
   j. a heat sink in heat-conducting relationship with the foundation member;
   k. a nonconductive package enclosing the assembly, said package having an aperture therein; and
   l. the heat sink being in electrical and heat-conducting communication with the foundation member, at least partly contained within said package, and exposed in said aperture.

2. The integrated assembly of claim 1 wherein the circuitry comprises random access memory circuitry.

3. The integrated circuit assembly of claim 1 or claim 2 wherein the dielectric layer is a native oxide of the semiconductor substrate material.

4. The integrated circuit assembly of claim 3 wherein the substrate is of a silicon composition and the native oxide is silicon dioxide.

5. The integrated circuit assembly of claim 1 or claim 2 wherein the substrate is of a silicon composition and the dielectric is a silicon nitride.

6. The integrated circuit assembly of claim 1 or claim 2 wherein the substrate is of a silicon composition and the dielectric is a ferroelectric.

7. The integrated circuit assembly of claim 1 or claim 2 further including a layer of a conductive material applied directly on the surface of the substrate, the layer of dielectric material being applied to said conductive material.

* * * * *